United States Patent [19]
Hiroi et al.

[11] Patent Number: 5,151,771
[45] Date of Patent: Sep. 29, 1992

[54] HIGH LEAD COUNT CIRCUIT BOARD FOR CONNECTING ELECTRONIC COMPONENTS TO AN EXTERNAL CIRCUIT

[75] Inventors: Atsushi Hiroi; Mitsuhiro Kondo; Kinya Ohshima, all of Oogaki, Japan

[73] Assignee: Ibiden Co., Ltd, Japan

[21] Appl. No.: 646,355

[22] Filed: Jan. 28, 1991

[30] Foreign Application Priority Data

May 31, 1990 [JP] Japan .................... 2-143977

[51] Int. Cl.5 .................... H01L 23/48; H01L 29/44
[52] U.S. Cl. .................... 357/70; 357/71; 357/74; 357/80; 361/404; 361/409; 361/410
[58] Field of Search ............. 361/404, 406, 409, 410; 357/68, 70, 71, 74, 80

[56] References Cited

U.S. PATENT DOCUMENTS

| | | | |
|---|---|---|---|
| 4,320,438 | 3/1982 | Ibrahim et al. | 361/401 |
| 4,423,468 | 12/1983 | Gatto et al. | 361/404 |
| 4,437,141 | 3/1984 | Prokop | 361/403 |
| 4,558,397 | 12/1985 | Olsson | 361/404 |
| 4,891,687 | 1/1990 | Mallik et al. | 357/70 |
| 4,949,225 | 8/1990 | Sagisaka et al. | 361/414 |
| 5,032,895 | 7/1991 | Horiuchi et al. | 357/72 |

FOREIGN PATENT DOCUMENTS

59-98543  6/1984  Japan .

*Primary Examiner*—Rolf Hille
*Assistant Examiner*—David Ostrowski
*Attorney, Agent, or Firm*—Leydig, Voit & Mayer

[57] ABSTRACT

A circuit board for mounting an electronic component comprises an electrically insulating substrate having a recess for mounting the electronic component therein, a plurality of first leads disposed in the substrate side-by-side with a space therebetween and a plurality of second leads disposed between the first leads. Each first lead has an outer end projecting outwardly from the substrate and an inner end embedded within the substrate. Each second lead has an outer end outwardly extending from the substrate and an inner end exposed within the recess so that an electrical connection to the electronic component can be provided. One surface of the substrate has attached thereto a plurality of conductors, each having an outer end and an inner end disposed close to the recess for electrical connection to the electronic component. The inner end of the first leads are connected to the outer ends of the conductors by through-hole conductors which penetrate the substrate.

12 Claims, 6 Drawing Sheets

FIG. I
PRIOR ART
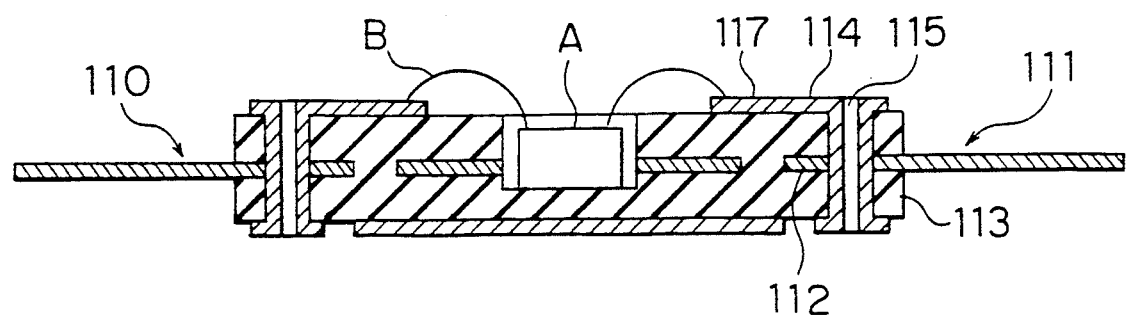
FIG. 2
PRIOR ART
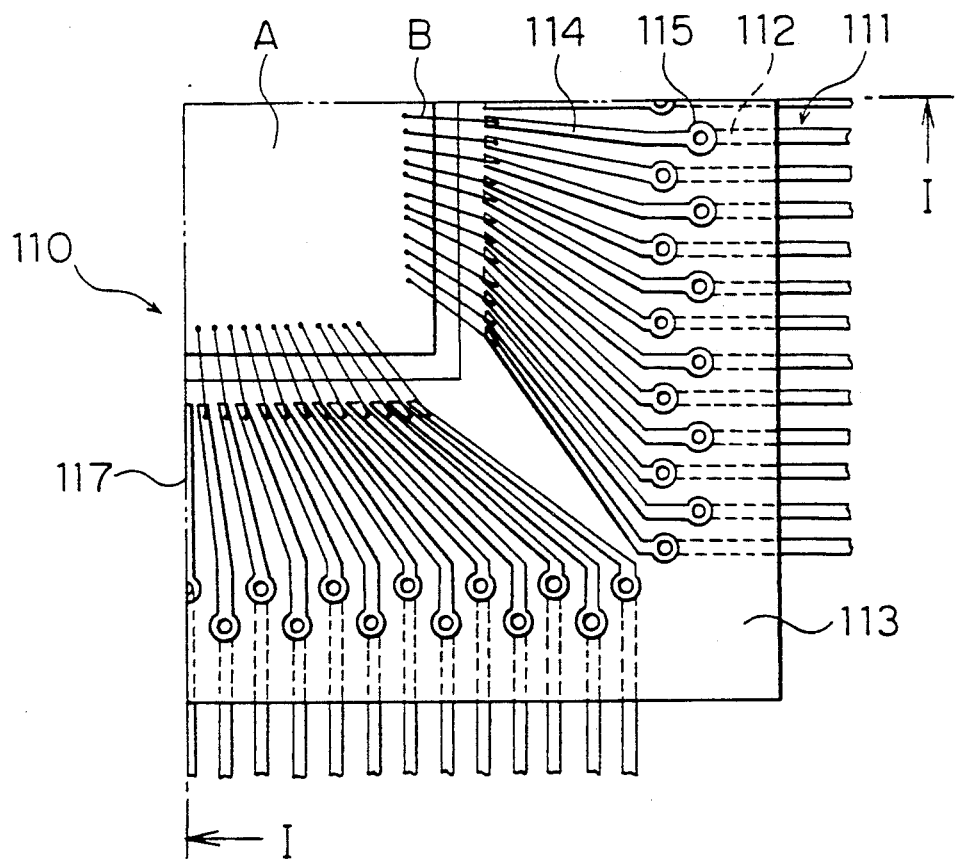

HIGH LEAD COUNT CIRCUIT BOARD FOR CONNECTING ELECTRONIC COMPONENTS TO AN EXTERNAL CIRCUIT

BACKGROUND OF THE INVENTION

This invention relates to a circuit board for mounting an electronic component and, more particularly, to a circuit board having a large number of leads for connecting one or more electronic components attached to the board to an external circuit.

FIGS. 1 and 2 illustrate one example of a conventional circuit board 110 for mounting an electronic component such as a semiconductor chip. As shown in the FIGS., a plurality of leads 111 have integrally formed on their inner ends inner connection portions 112 and a substrate 113 is provided on both sides of the inner connection portions 112 so that each lead 111 projects from the substrate 113. Also, the inner connection portions 112 are electrically connected to conductors 114 formed on at least one surface of the substrate 113 by through holes 115 so that the inner ends of the conductors 114 may be used as bonding terminals 117 to which bonding wires B for electrically connecting an electronic component A are bonded.

In recent years, it has become very desirable to increase the number of outer leads (input and output pins) of the circuit board, so that a high speed electronic component having a large number of electrodes can be mounted.

However, in the conventional electronic component mounting circuit board 110 as described above, even though the width of the leads 111 is made narrow and the distance between the leads 111 is made small in order to provide as many outer leads 111 as possible on the substrate 113, each lead 111 needs one through-hole connector 115 for internally connecting the leads 111 and the conductors 114. Because the through-hole connector 115 requires a space larger than that for the outer leads 111, the number of the outer leads 111 is still limited by the through-hole connectors 115. A standard dimensional relationship of the transverse dimension of the through-hole connector 115 and the distance between the leads 111 relative to the width of the lead 111 is 2:1.33:1.

FIG. 3 illustrates another known arrangement of the circuit board 110a for mounting an electronic component A, in which an additional insulating substrate 113a having conductors 114a is attached on the top surface of the first substrate 113 and each conductor 114a on the upper substrate 113a is electrically connected by a longer through-hole conductor 115a to the corresponding outer lead 111 to provide a bonding terminal 117a to which the bonding wire B is bonded. Thus, the area in which the bonding wires B and the bonding terminals 117 and 117a are most crowded is made in a "stadium" structure in which the bonding terminals 117 and 117a are located at the different levels for easy wire bonding as illustrated in FIG. 3. Even in this arrangement, however, one through-hole connector 115 or 115a is required for each of the outer leads 111 and the above-discussed problems remain unsolved. Moreover, since the conductors 114 and 114a as well as the bonding terminals 117 and 117a are located at different levels with an electrically insulating substrate therebetween, the overall thickness and the manufacturing cost of the circuit board is increased, increasing the bulk of the device.

Also, Japanese Patent Laid-Open No. 59-98543 discloses a circuit board for mounting an electronic component in which a large number of leads are provided by bonding thin conductive layers to the lead frame with an insulating layer therebetween. However, since the outer leads have a multilayered structure in which thin conductor layers are bonded to the lead frame with the insulating layer sandwiched therebetween, the insulating layer may crack when it is bent at the time of supplying as parts, whereby the electrical insulation between the lead frame and the conductive layer is degraded. Accordingly, the inner and the outer leads must be wired in the same order (i.e., not in a crossing relationship) so as to prevent the inner and outer leads from contacting each other, thereby limiting freedom of design.

SUMMARY OF THE INVENTION

Accordingly, one object of the present invention is to provide a circuit board for mounting an electronic component free from the above-discussed problems.

Another object of the present invention is to provide a circuit board for mounting an electronic component which has a large number of output leads while still having a small size.

A further object of the present invention is to provide a circuit board for mounting an electronic component having a large number of outer leads and a relatively small thickness.

Another object of the present invention is to provide a circuit board for mounting an electronic component having a relatively high degree of design freedom.

Still another object of the present invention is to provide a circuit board for mounting an electronic component which can be relatively easily manufactured.

Accordingly, the present invention provides a circuit board for mounting an electronic component. The circuit board comprises an electrically insulating substrate having a first and a second major surfaces, an outer peripheral side surface, and a recess formed in the first major surface for mounting the electronic component therein. The circuit board also comprises a plurality of outer leads including a plurality of first leads disposed in the substrate in a substantially side-by-side relationship with a space therebetween and a plurality of second leads disposed between the first leads with a space therebetween. Each of the first leads has an outer end outwardly extending from the outer peripheral side surface of the substrate and an inner end within the substrate. Each of the second leads has an outer end outwardly extending from the outer peripheral side surface of the substrate and an inner end exposed within the recess for electrical connection to the electronic component. The circuit board further comprises a plurality of first conductors and a plurality of through-hole conductors. The first conductors are attached to the first major surface of the substrate and have an outer end and an inner end disposed in the vicinity of the recess for electrical connection to the electronic component. The through-hole conductors are disposed in the substrate, each extending therethrough and electrically connecting the inner end of a first outer lead and the outer end of a first conductor.

The present invention also provides a circuit board for mounting an electronic component, the circuit board comprising a substrate, a plurality of first leads, and a plurality of conductors. The substrate has first and second opposing surfaces and a recess which is formed in the first surface and in which the electronic component can be mounted. Each of the first leads extends through the substrate between the first and second surfaces and has an end portion which terminates within the substrate spaced from the recess. Each of the second leads extends between a pair of first leads through the substrate between the first and second surfaces to the recess and has an exposed portion in the recess. Each of the conductors has a first portion extending along the first surface of the substrate from the vicinity of the recess and a second portion which connects the first portion of the conductor to an end portion of a first lead.

The present invention further provides a circuit board for mounting an electronic component, the circuit board comprising a substrate, a plurality of first leads, a plurality of second leads, and a plurality of conductors. The substrate has first and second opposing surfaces and a recess which is formed in the first surface and in which the electronic component can be mounted. Each of the first leads has an end portion which terminates within the substrate spaced from the recess and each of the first leads has through-hole conductors extending through the substrate between the first and second surfaces, adjacent through-hole conductors being spaced at different distances from the recesses. Each of the second leads extends between a pair of first leads. Each of the conductors has a first portion extending along the first surface of the substrate from the vicinity of the recess and a second portion which connects the first portion of the conductors to an end portion of a first lead.

The present invention additionally provides a circuit board for mounting an electronic component, the circuit board comprising a substrate, a plurality of first leads, a plurality of second leads, and a plurality of conductors. The substrate has first and second opposing surfaces and a recess which is formed in the first surface and in which the electronic component can be mounted. Each of the first leads extends through the substrate between the first and second surfaces and has an end portion which terminates within the substrate spaced from the recess. Each of the second leads extends between a pair of first leads, the second leads having an exposed portion in the recess. Each of the conductors has a first portion extending along the first surface of the substrate from the vicinity of the recess and a second portion which connects the first portion of the conductor to an end portion of a first lead.

BRIEF DESCRIPTION OF THE DRAWINGS

The present invention will become more readily apparent from the following detailed description of several embodiments of the present invention taken in conjunction with the accompanying drawings, in which:

FIG. 1 is a sectional side view of a conventional circuit board for mounting an electronic component taken along line I—I of FIG. 2;

FIG. 2 is a fragmental plan view of the conventional circuit board for mounting an electronic component illustrated in FIG. 1;

DESCRIPTION OF EMBODIMENTS

Figure 3:
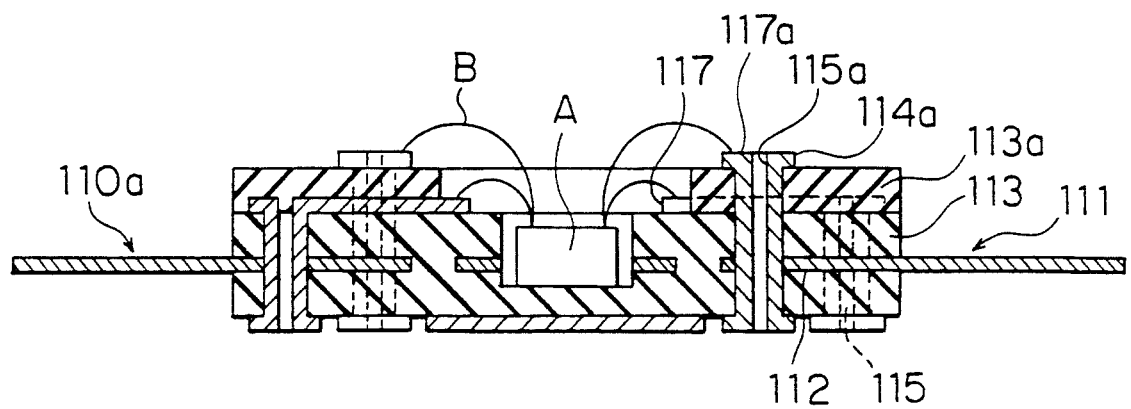
FIG. 3 is a sectional side view of another conventional circuit board for mounting an electronic component.
Figure 4:
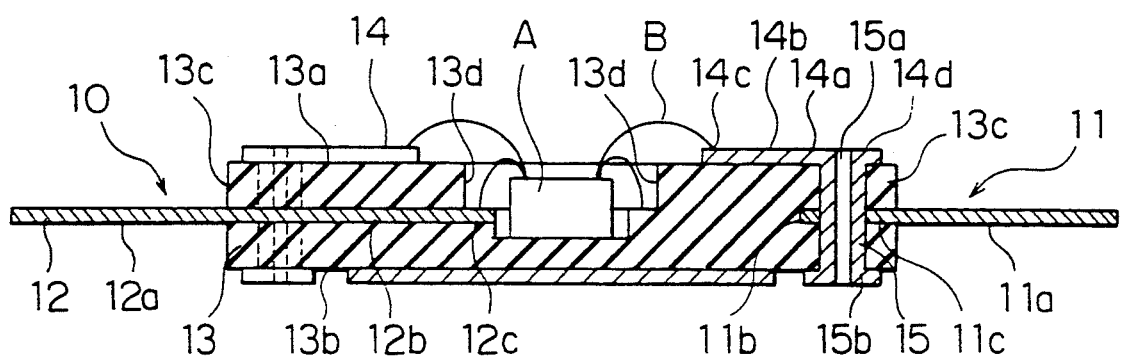
FIG. 4 is a sectional side view of a circuit board for mounting an electronic component of the present invention taken along line IV—IV of FIG. 5.
Figure 5:
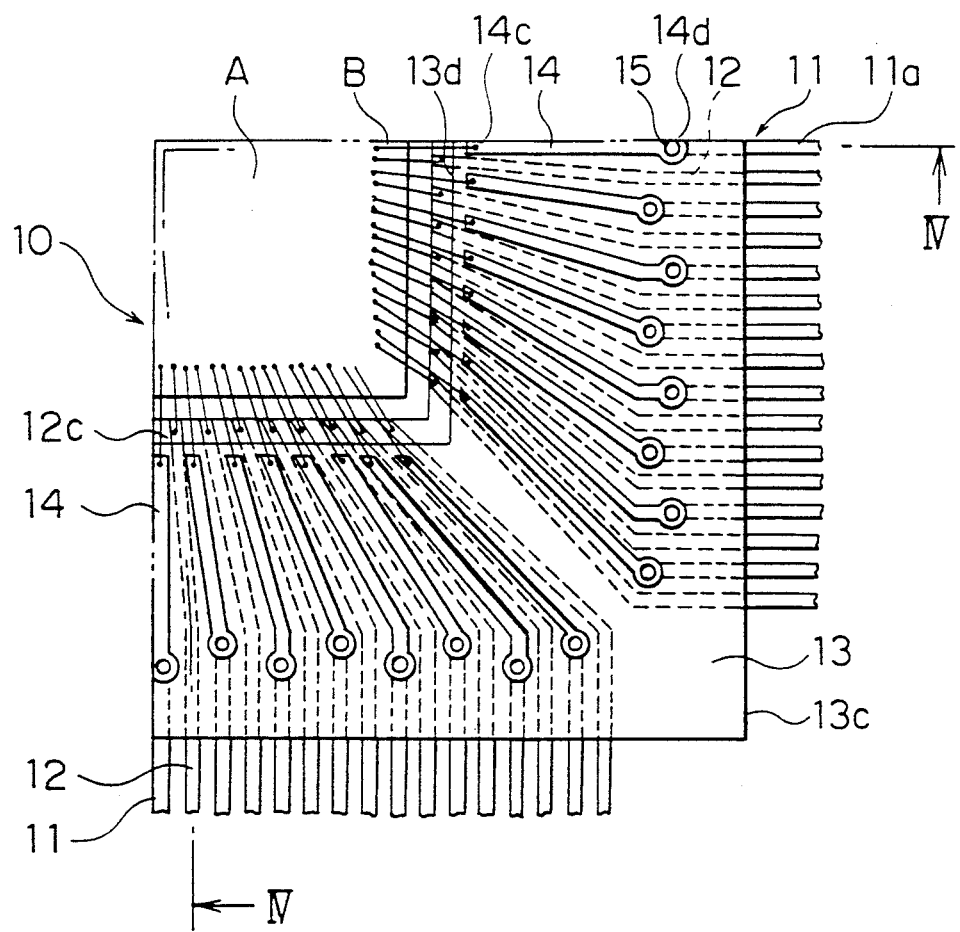
FIG. 5 is a fragmental plan view of the circuit board illustrated in FIG. 4.

FIGS. 4 and 5 illustrate a circuit board 10 of the present invention with an electronic component A such as a semiconductor chip mounted thereon. The circuit board 10 comprises an electrically insulating substrate 13 which may have any convenient shape. In the illustrated embodiment, the substrate 13 is substantially square and has first and second major surfaces 13a and 13b which are generally parallel to and oppose one another. The substrate 13 also has outer peripheral side surfaces 13c and a recess 13d formed in the center of the first major surface 13a for mounting the electronic component A therein. The recess may have any suitable shape for accommodating the electronic component, including, for example, a substantially squire shape. The substrate 13 may be made of a suitable well known epoxy resin material.

The circuit board 10 also comprises a plurality of leads which may be formed from any suitably conductive material, such as copper. The leads include a plurality of first leads 11 disposed in the substrate 13 in a substantially side-by-side relationship with a space therebetween and a plurality of second leads 12 disposed between the first leads 11 as viewed perpendicularly from the first major surface 13a of the substrate 13. The plurality of first leads and the plurality of second leads are preferably coplanar. Each of the first leads 11 has an outer lead 11a outwardly extending from the outer peripheral side surface 13c to the exterior of the substrate 13 and an inner lead 11b embedded within the substrate 13. As best seen from FIG. 6, the inner lead 11b has a substantially circular enlarged area 11c for an electrical connection which will be described later. Each of the second leads 12 has an outer lead 12a outwardly extending from the outer peripheral side surface 13c to the exterior of the substrate 13 and an inner lead 12b extending through the substrate 13 and exposed at its inner extremity within the recess 13d. The exposed ends of the inner leads 12b provide bonding pads 12c for attaching bonding wires B for electrical connection to the electronic component A.

The circuit board 10 further comprises a plurality of elongated conductors 14 which are also formed from a suitably conductive material, such as copper. Each conductor 14 is attached to the first major surface 13a of the substrate 13 and has an outer end 14a and an inner end 14b. The inner end 14b extends toward the electronic component A and is terminated in the vicinity of the recess 13d to provide a bonding pad 14c to which a bonding wire B for electrically connecting the electronic component A is bonded. The outer end 14a has a substantially circular enlarged area 14d at its extremity and the enlarged area 14d is disposed in registry with the enlarged area 11c of the first lead 11 within the substrate 13.

The elongated conductors 14 are electrically connected to the first lead 11 by a plurality of through-hole conductors 15, which extend through the substrate 13 substantially perpendicularly to the plane of the major surface 13a. Each of the through-hole conductors 15 is electrically connected at one end 15a thereof to the enlarged area 14d of the outer end 14a of the conductor 14 and at its middle portion to the enlarged area 11c of the inner end 11b of the first lead 11. The other end 15b of the through-hole conductor 15 extends through the substrate 13 and is exposed to the second major surface 13b of the substrate 13.

FIGS. 6 to 14 illustrate various steps of the method for manufacturing the circuit board 10 illustrated in FIGS. 4 and 5 of the present invention.

Figure 6:
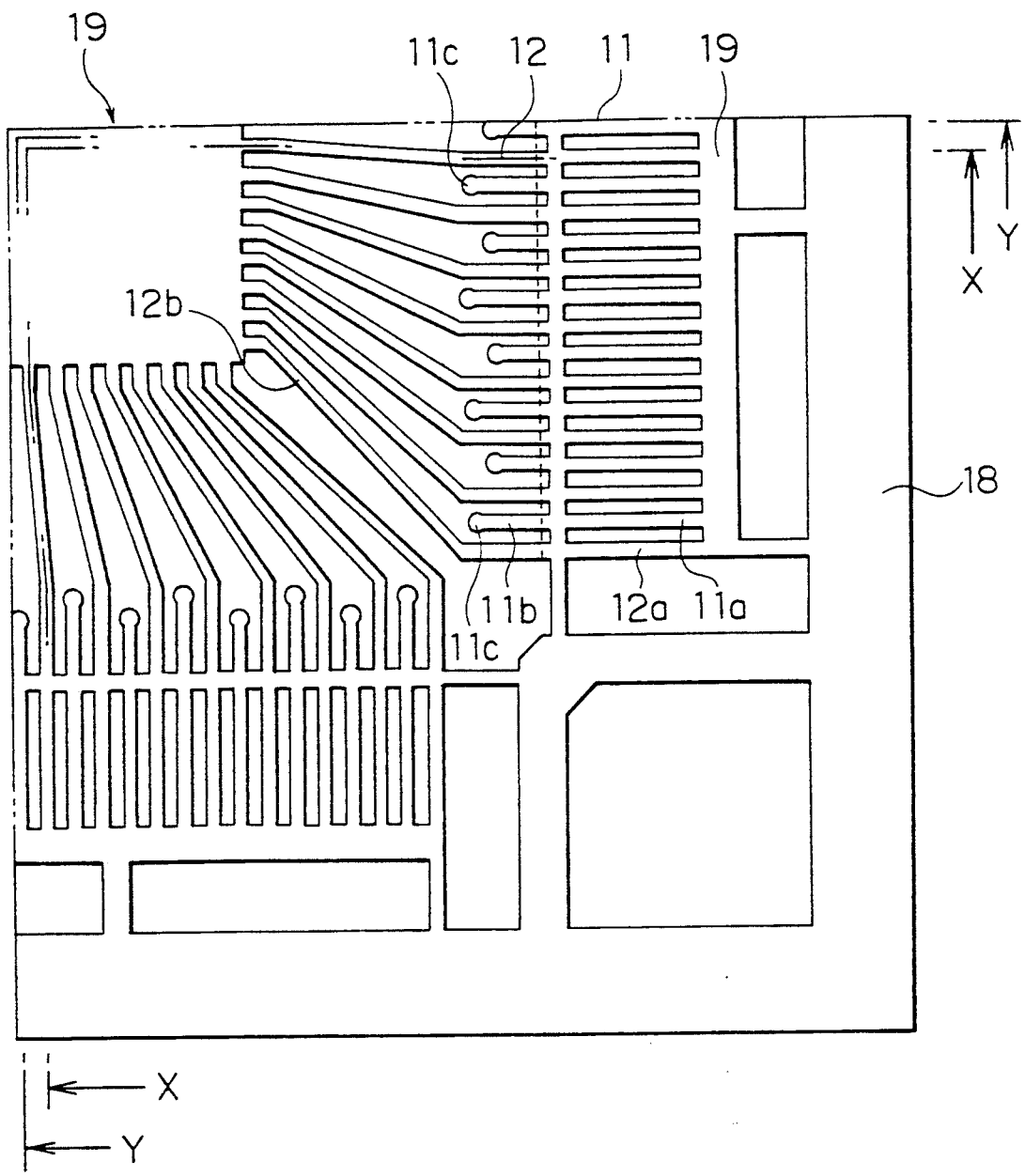
FIG. 6 is a fragmental plan view of a lead frame for use with the circuit board of the present invention.

FIG. 6 is a fragmental plan view of a lead frame 18 in which the first leads 11 and the second leads 12 are integrally formed in a predetermined side-by-side pattern in a copper sheet. It is seen that the outer ends 11a of the first leads 11 and the outer ends 12a of the second leads 12 are connected to each other by connecting pieces 19, such as tie bars, to maintain each of the leads 11 and 12 in a predetermined position. Each of the inner ends 11b of the first leads 11 has a substantially circular connection pad 11c having a diameter larger than the width of the first lead 11, and each of the inner ends 12b of the second leads 12 inwardly extends so that it can be exposed in the recess 13d (FIGS. 4 and 5) and serve as the bonding pad 12c for electrical connection to the electronic component A.

FIGS. 7 to 10 illustrate the circuit board of the present invention at various manufacturing steps substantially taken along line X—X of FIG. 6, and FIGS. 11 to 14 illustrate the circuit board of the present invention at manufacturing steps corresponding to FIGS. 7 to 10 but substantially taken along line Y—Y of FIG. 6.

Figure 7:
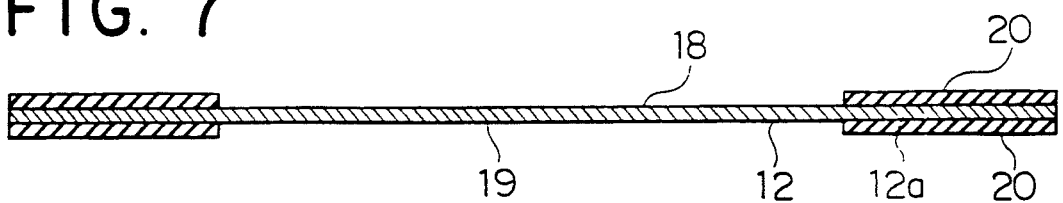
FIG. 7 is a sectional view of the lead frame illustrated in FIG. 6 taken along line X—X of FIG. 6 and illustrating how the separation layer is formed.
Figure 11:
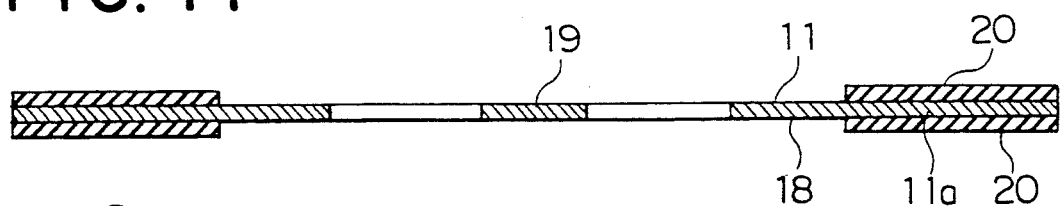
FIG. 11 is a sectional view of the lead frame illustrated in FIG. 6 and corresponding to FIG. 7 but taken along line Y—Y of FIG. 6.

In FIGS. 7 and 11, a separator layer 20 is applied on both sides of the lead frame 18 at an outer peripheral region corresponding to the outer ends 11a and 12a of the first and second leads 11 and 12. The separator layer 20 facilitates removal of a section of the substrate 13 to expose the outer ends 11a and 12a of the leads 11 and 12 and may be polyphenylenesulphide (PPS) for example.

Figure 8:
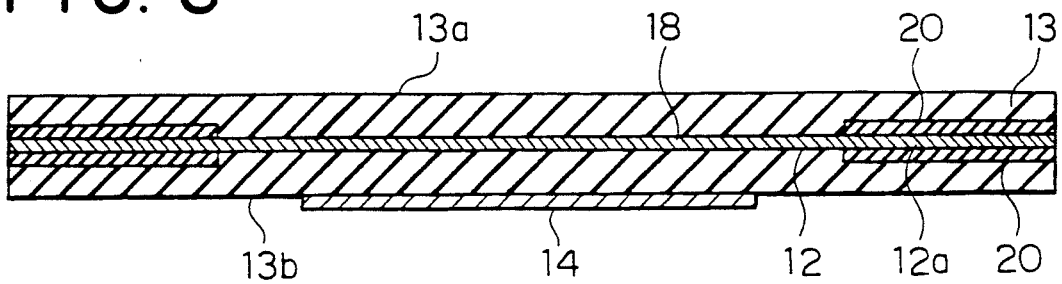
FIG. 8 is a sectional view illustrating how the substrate and the conductor layer are formed on the lead frame illustrated in FIG. 7.
Figure 12:
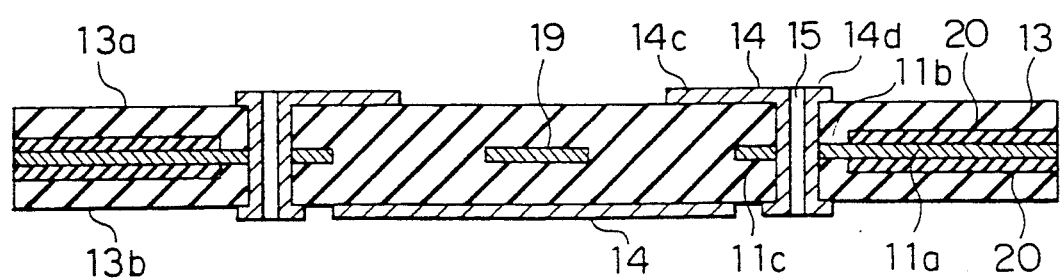
FIG. 12 is a sectional view illustrating how the substrate and the conductor layer together with the through holes are formed on the lead frame illustrated in FIG. 11.

In FIGS. 8 and 12, an electrically insulating substrate 13 having first and second major surfaces 13a and 13b substantially parallel to the lead frame 18 is formed on the lead frame 18 so that the entire lead frame 18 is centrally embedded within the substrate 13. The substrate 13 may be any well known resin material. Then, the through-hole conductors 15 together with the film conductors 14 are formed on selected areas of the major surfaces 13a and 13b of the substrate 13 as well as on the inner cylindrical surfaces of the through holes extending through the substrate 13. In particular, each of the plurality of through-hole conductors 15 extends through the substrate 13 from its first major surface 13a to the second major surface 13b to electrically connect the rounded end 11c at the inner end 11b of the first lead 11 to the rounded end 14d at the outer end 14a of the conductors 14. The conductors 14 and the through-hole conductors 15 may be separately formed in the order discussed above or opposite thereto and may be formed by any suitable method, such as selective copper deposition.

Figure 9:
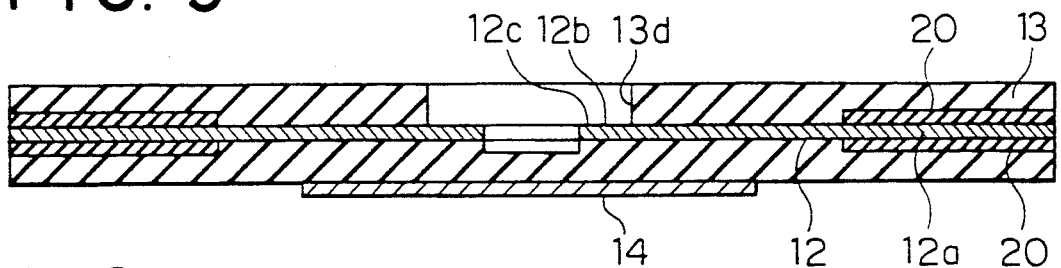
FIG. 9 is a sectional view illustrating how the recess is formed in the substrate and the inner ends of the outer leads are exposed.
Figure 13:
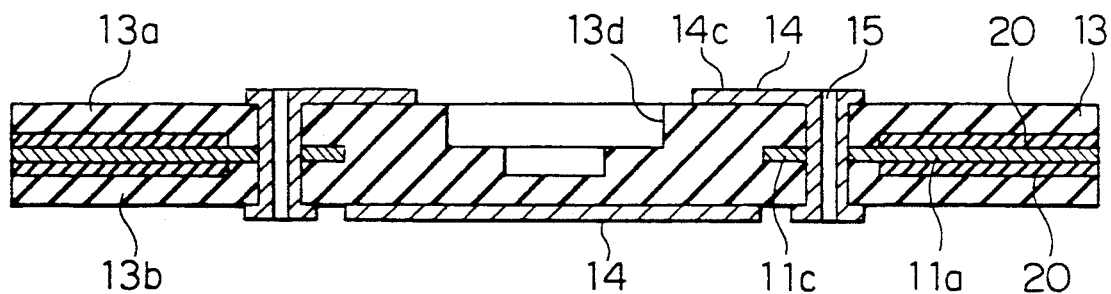
FIG. 13 is a sectional view illustrating how the recess is formed in the substrate illustrated in FIG. 12.

In FIGS. 9 and 13, a recess 13d for mounting the electronic component A therein is formed in the substrate 13 along the first major surface 13a by a laser beam (not shown). The recess may have any convenient configuration. For example, the recess 13d is substantially square in plan and has a stepped configuration in section so that a shelf portion of the recess 13d exposes the inner end 12b of the second leads 12 to provide the bonding pads 12c for electrical connection to the electronic component A (FIG. 4).

Figure 10:
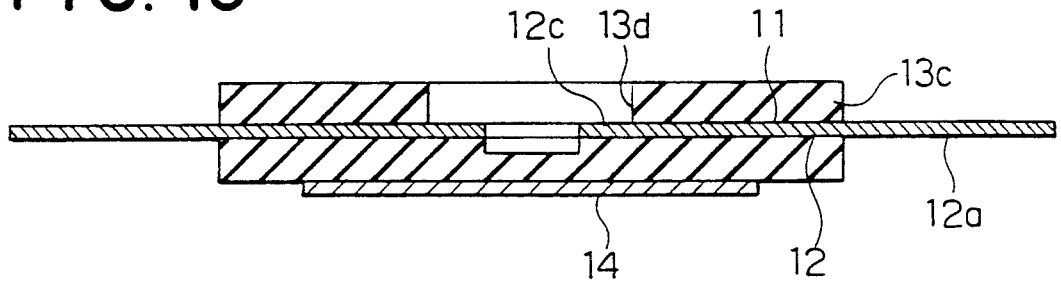
FIG. 10 is a sectional view illustrating how the outer peripheral portion of the substrate shown in FIG. 9 is removed.
Figure 14:
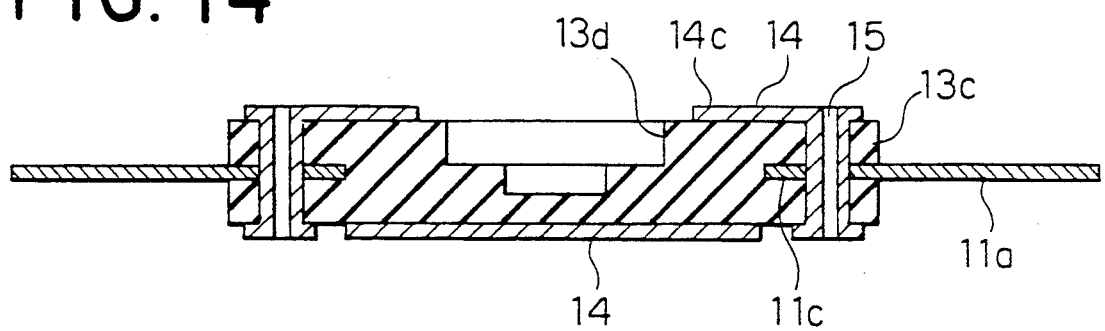
FIG. 14 is a sectional view illustrating how the outer peripheral portion of the substrate illustrated in FIG. 13 is removed.

Finally, as illustrated in FIGS. 10 and 14, the outer region of the substrate 13 and the separate layer 20 corresponding to or covering the outer ends 11a and 12a of the leads 11 and 12 are removed by a laser beam (not shown) to define the outer peripheral side surfaces 13c of the substrate 13. The outer ends 11a and 12a of the first and the second leads 11 and 12 project outwardly from the substrate side surfaces 13c for electrical external connection.

Figure 15:
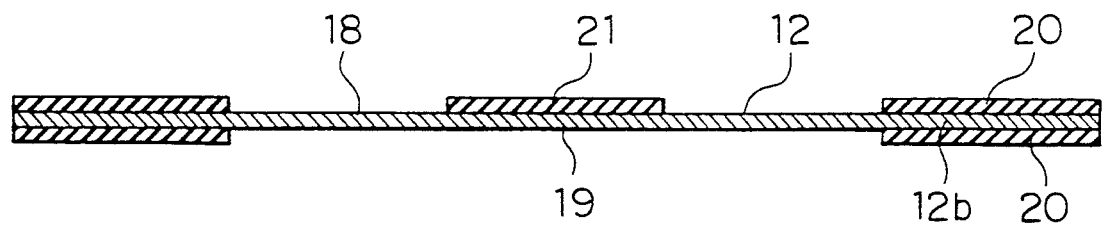
FIG. 15 is a sectional view of the lead frame with a centrally disposed separation layer.

FIG. 15 illustrates a step corresponding to that illustrated in FIGS. 7 and 11, in which a second separator layer 21 is provided on the central region 19 of the lead frame 18 corresponding to the recess 13d accommodating the electronic component. Then, a substrate 13, similar to that illustrated in FIGS. 8 and 12, is formed on the lead frame 18. The second separator layer 21 is useful in the first substrate removing step in that it allows for easy removal of this section of the substrate 13 without damaging the bonding surfaces or the bonding pads 12c of the second leads 12. After the bonding pads 12c are exposed by the first removing step in which a first recess is formed, a deeper but samller second recess is formed to create the stepped recess 13d illustrated in FIG. 4, for example. Whereupon, the bonding pads 12c at the inner ends of the second leads 12 are separated from the central region 19. Other steps may be identical to those previously described.

Figure 16:
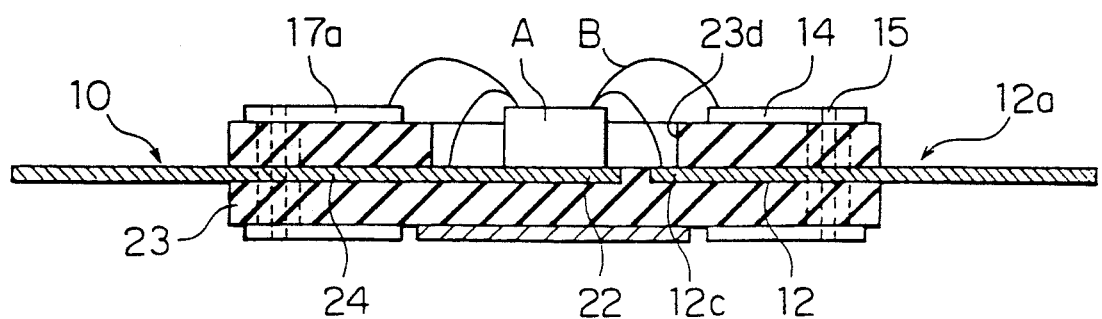
FIG. 16 is a sectional view of the circuit board of another embodiment of the present invention.

FIG. 16 illustrates still another modification in which a metallic layer 22, which is similar to the connecting piece 19 illustrated in FIG. 6, is provided at the center of a lead frame. This metallic layer 22 stays in the bottom surface of the recess 23d of the substrate 23 and serves as a grounding electrode for grounding the electronic component A through an electric circuit which extends from the metallic layer 22 to a grounding lead 24 directly connected to the metallic layer 22. The metallic layer 22 also serves as a heat conductor through which the generated heat can escape. Therefore, while the signal line leads 11 and 12 (only one second lead 12 is shown in FIG. 16) are separated from the metallic layer 22, the metallic layer 22 remains electrically and mechanically connected to the grounding lead 24, which preferably has a relatively large cross-sectional area for providing good thermal conduction.

What is claimed is:

1. A circuit board for mounting an electronic component, the circuit board comprising:

an electrically insulating substrate having a first and a second major surfaces, an outer peripheral side surface, and a recess formed in said first major surface for mounting the electronic component therein;

a plurality of leads including a plurality of first leads disposed in said substrate in a substantially side-by-side relationship with a space therebetween and a plurality of second leads disposed between said first leads with a space therebetween, said first leads each having an outer end outwardly extending from said outer peripheral side surface of said substrate and an inner end within said substrate, and said second leads each having an outer end outwardly extending from said outer peripheral side surface of said substrate and an inner end exposed within said recess for electrical connection to said electronic component;

a plurality of first conductors, each attached to said first major surface of said substrate and having an outer end and an inner end disposed in the vicinity of said recess for electrical connection to said electronic component; and a plurality of through-hole conductors, each extending through said substrate and electrically connected between said inner end of one of said first leads and said outer end of one of said first conductors.

2. A circuit board for mounting an electronic component as claimed in claim 1 wherein said inner end of said first leads and said outer end of said first conductors are spaced in a direction substantially perpendicular to said first major surface of said substrate, and wherein said through-hole conductors extend between said second leads.

3. A circuit board for mounting an electronic component as claimed in claim 2 wherein said through-hole conductors extend from said first major surface to said second major surface.

4. A circuit board for mounting an electronic component, the circuit board comprising:

a substrate having first and second opposing surfaces and a recess which is formed in the first surface and in which the electronic component can be mounted;

a plurality of first leads, each extending through the substrate between the first and second surfaces and having an end portion with terminates within the substrate spaced from the recess;

a plurality of second leads, each extending between a pair of first leads through the substrate between the first and second surfaces to the recess and having an exposed portion in the recess; and a plurality of conductors, each having a first portion extending along the first surface of the substrate from the vicinity of the recess and a second portion which connects the first portion of the conductor to an end portion of a first lead.

5. A circuit board for mounting an electronic component as claimed in claim 4 wherein said first lead and said second lead are generally coplanar.

6. A circuit board for mounting an electronic component as claimed in claim 4 wherein said first and second surfaces are substantially parallel.

7. A circuit board for mounting an electronic component as claimed in claim 4 wherein the second portion of each conductor comprises a through-hole conductor which extends from the first surface to the second surface of the substrate.

8. A circuit board for mounting an electronic component as claimed in claim 4 wherein said first leads and said second leads extend outwardly to the exterior of the substrate.

9. A circuit board for mounting an electronic component, the circuit board comprising:

a substrate having first and second opposing surfaces and a recess which is formed in the first surface and in which the electronic component can be mounted;

a plurality of first leads, each having through-hole conductors extending through the substrate between the first and second surfaces and having an end portion which terminates within the substrate spaced from the recess, wherein adjacent through hole conductors are spaced at different distances from the recess;

a plurality of second leads, each extending between a pair of first leads; and a plurality of conductors, each having a first portion extending along the first surface of the substrate from the vicinity of the recess and a second portion which connects the first portion of the conductor to an end portion of a first lead.

10. A circuit board for mounting an electronic component as recited in claim 9 wherein the second leads extend through the substrate between the first and second surfaces.

11. A circuit board for mounting an electronic component, the circuit board comprising:

a substrate having first and second opposing surfaces and a recess which is formed in the first surface and in which the electronic component can be mounted;

a plurality of first leads each extending through the substrate between the first and second surfaces and having an end portion which terminates within the substrate spaced from the recess;

a plurality of second leads, each extending between a pair of first leads wherein the second leads have an exposed portion in the recess; and a plurality of conductors, each having a first portion extending along the first surface of the substrate from the vicinity of the recess and a second portion which connects the first portion of the conductor to an end portion of a first lead.

12. A circuit board for mounting an electronic component as recited in claim 11, wherein the second leads are formed in a single plane.

* * * * *